US006933766B2

(12) United States Patent
Khlat et al.

(10) Patent No.: US 6,933,766 B2
(45) Date of Patent: Aug. 23, 2005

(54) APPARATUS AND METHOD FOR IMPROVED CHOPPING MIXER

(75) Inventors: Nadim Khlat, Cugnaux (FR); Eddie Lorenzo-Luaces, Sanford, FL (US); Babak Bastani, Chandler, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 10/362,031

(22) PCT Filed: Jul. 16, 2001

(86) PCT No.: PCT/EP01/08154

§ 371 (c)(1),
(2), (4) Date: Jun. 5, 2003

(87) PCT Pub. No.: WO02/15385

PCT Pub. Date: Feb. 21, 2002

(65) Prior Publication Data

US 2004/0041616 A1 Mar. 4, 2004

(30) Foreign Application Priority Data

Aug. 17, 2000 (EP) .............................. 00402301

(51) Int. Cl.[7] ................................................ G06F 7/44
(52) U.S. Cl. ....................................... 327/359; 455/333
(58) Field of Search ................................ 327/356, 357, 327/359; 455/326, 333

(56) References Cited

U.S. PATENT DOCUMENTS

| 4,242,634 | A | * | 12/1980 | Metcalf | 324/142 |
|---|---|---|---|---|---|
| 5,301,072 | A | * | 4/1994 | Wilson | 360/77.01 |
| 5,630,228 | A | * | 5/1997 | Mittel | 455/326 |
| 5,771,442 | A | | 6/1998 | Wang et al. | |
| 5,859,559 | A | | 1/1999 | Hong et al. | |
| 5,973,576 | A | | 10/1999 | Ariie | |
| 6,456,144 | B2 | * | 9/2002 | Catala | 327/359 |
| 6,594,478 | B1 | * | 7/2003 | Nair et al. | 455/333 |

FOREIGN PATENT DOCUMENTS

| GB | 2 151 863 A | 7/1985 |
|---|---|---|
| WO | WO 00 19653 | 4/2000 |

OTHER PUBLICATIONS

Pascal Philippe et al., "A Multioctave Active GaAs MMIC Quadrature Phase Shifter," *IEEE Transactions on Microwave Theory and Techniques*, Dec. 1989, pp. 2119–2124, vol. 37, No. 12, New York, USA.

* cited by examiner

*Primary Examiner*—Kenneth B. Wells

(57) ABSTRACT

An apparatus and method for an improved chopping mixer (100) having a bipolar mixer stage (140) for mixing signals (Ip, In, LOp, LOn) received thereby; an output chopping stage (160); and an AC coupling stage (150) for coupling the mixed signal to the output chopping stage. The signal prior to the chopping output stage is centered at the chopping clock frequency rather than DC. AC coupling allows removal of common mode signal in a desired frequency range. Also, the second order component present on each single ended output will also be DC blocked by the AC coupling capacitors, resulting in improved second order IP2 performance.

9 Claims, 2 Drawing Sheets

APPARATUS AND METHOD FOR IMPROVED CHOPPING MIXER

FIELD OF THE INVENTION

This invention relates to chopping mixers, and particularly (though not exclusively) to radio frequency circuitry such as direct conversion receivers.

BACKGROUND OF THE INVENTION

In the field of this invention it is known to use direct conversion or zero-IF receivers in radio receivers for applications such as cellular telephony. In such receivers, it is necessary to maintain the spectral purity of the channel used for reception. Because of limited narrow band selectivity, second order intermodulation distortion (IM2) presents an undesired spectral component within the signal band of interest. This occurs when two or more interfering signals, whose difference in frequency is less than the IF bandwidth of the desired signal, mix with one another due to some second order nonlinearity and produce a baseband spectral component. To minimize the effects of second order intermodulation within critical circuit blocks in the signal path, it is known in the art to use differential circuits. In theory, differential circuits have infinite attenuation to second order intermodulation distortion; however, in reality this is far from the truth, due in no small part to device mismatches, parametric imbalance, imperfect layout, and other device characteristic inequalities that cause imbalances which provide a lower than desired second order input intercept point (IIP2). As will be appreciated by those skilled in the art, the best IIP2 achieved to date in the integrated mixer art may fall significantly short of system requirements. It would be extremely advantageous, therefore, to provide improved chopping mixer performance so as to allow the above difficulties to be overcome. It would be of greater advantage to apply this improved chopping mixer performance to wireless and wireline communications, devices that employ mixer circuits, switches, and other components that exhibit parametric mismatch or imbalance.

United States patent U.S. Pat. No. 5,859,559 (RAYTHEON) describes a mixer structure suitable for inclusion as part of an integrated circuit. Spurious signals is avoided by introducing trickle currents which enhance the transconductance of an input differential amplifier.

United Kingdom Patent Application No. GB-A-2 151863 (Toshiba) describes an amplifier circuit having first and second differential amplifiers. A switch circuit enables the dynamic range of the output signals to be increased. First and second outputs are applied to a load so as to obtain the product of the first and second signals.

It is an object of the present invention to provide method and apparatus for improving chopping mixer performance wherein the abovementioned disadvantage(s) may be alleviated.

STATEMENT OF INVENTION

In accordance with a first aspect of the present invention there is provided a chopping mixer as claimed in claim 1.

In accordance with a second aspect of the present invention there is provided a method of operating a chopping mixer as claimed in claim 13.

BRIEF DESCRIPTION OF THE DRAWINGS

Method and apparatus for improving chopping mixer performance utilising the present invention will now be described, by way of example only, with reference to the accompanying drawing(s), in which.

DESCRIPTION OF PREFERRED EMBODIMENTS

Figure 1:
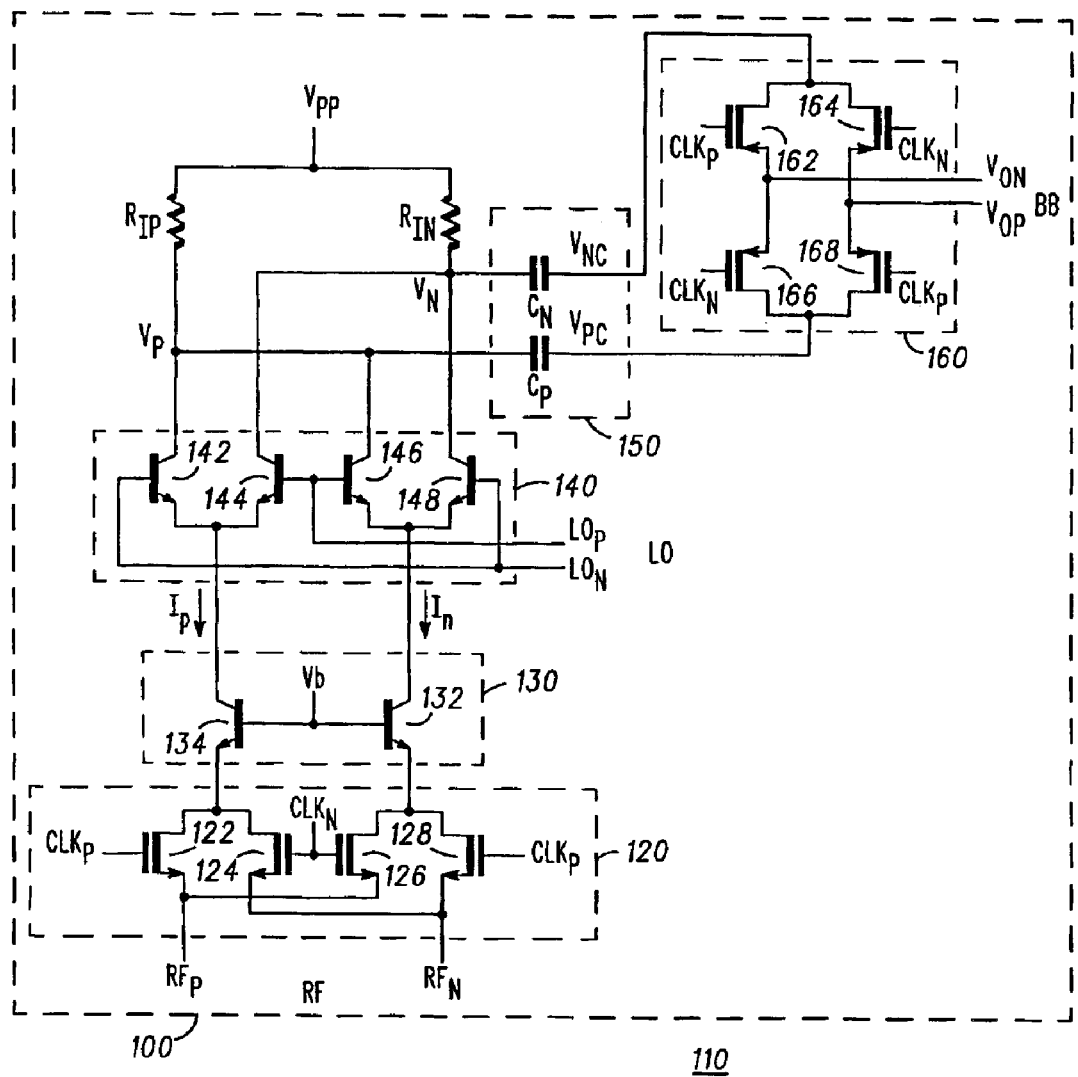
FIG. 1 shows a schematic circuit diagram of a first AC chopping mixer in a direct conversion radio receiver.
Figure 2:
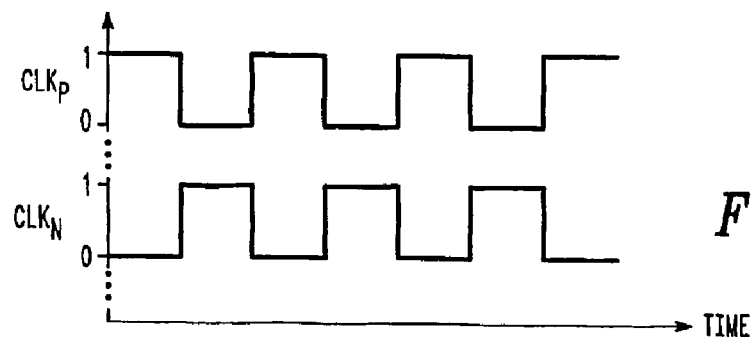
FIG. 2 shows a waveform timing diagram of clock signals used in the AC chopping mixer of FIG. 1.

Referring firstly to FIG. 1, an AC chopping mixer 100 for use in a direct conversion radio receiver 110 is shown. The mixer 100 has an input chopper cell 120 constituted of two pairs of MOSFET chopper transistors 122 & 124 and 126 & 128. The chopper transistors 122–128 are coupled to receive chopper clock signals clkp and clkn (see FIG. 2) and cross-coupled differential input signals RFp and RFn at an RF input port. The input chopper cell 120 produces chopped differential voltage output signals Vip and Vin.

A voltage-current (V-I) converter 130 is constituted of bipolar transistors 132 and 134 that have their base electrodes commonly coupled to receive a bias voltage Vb. Outputs from the chopper transistors 122–128 of the input chopper cell 120 are connected respectively to emitter electrodes of the bipolar transistors 132 and 134 in the voltage-current converter 130, so that the transistors sink at their collector electrodes currents Ip and In that are proportional to respectively the voltage output signals Vip and Vin from the input chopper cell 120.

A radio frequency (RF) mixer cell 140 is constituted of two pairs of bipolar transistors 142 & 144 and 146 & 148. The base electrodes of the transistors 142 and 148 are commonly coupled to receive an input signal LOn, and the base electrodes of the transistors 144 and 146 are commonly coupled to receive an input signal LOp, the signals LOp and LOn forming a differential input signal (at an LO input port) to be mixed with the differential input signal RFp, RFn (at the RF input port). The emitter electrodes of the bipolar transistors 142 and 144 are commonly connected to the collector electrode of the bipolar transistor 132, and the emitter electrodes of the bipolar transistors 146 and 148 are commonly connected to the collector electrode of the bipolar transistor 134, of the voltage-current converter 130. The collector electrodes of the bipolar transistors 142 and 146 are commonly coupled (via a resistance Rip) to a source of reference potential Vpp, to which the collector electrodes of the bipolar transistors 144 and 148 are also commonly coupled (via a resistance Rin).

An AC coupling cell 150 is constituted of capacitors Cn and Cp. One electrode of the capacitor Cn is connected to the commonly connected collector electrodes of the bipolar transistors 142 and 146, and one electrode of the capacitor Cp is connected to the commonly connected collector electrodes of the bipolar transistors 144 and 148. As will be explained below, the capacitors Cn and Cp may be realised as a programmable capacitor structure (not shown) to allow their capacitance to be varied.

An output chopper cell 160 is constituted of two pairs of MOSFET chopper transistors 162 & 164 and 166 & 168. The chopper transistors 162–168 are coupled to receive chopper clock signals clkp and clkn and are connected to the AC coupling cell 150 to the receive voltage signals Vnc and Vpc from the capacitors Cn and Cp respectively. The outputs of the chopper elements 162 and 164 are cross-coupled to produce differential output signals Von and Vop (at a BB output port), which are mixed from the differential input signals RFn & RFp (at the RF input port) and LOp & LOn (at the LO input port).

The performance of the AC chopping mixer 100 circuit may be analysed as follows:

At the chopper output stage, the differential output versus the differential input relation is given by:

$Vop=Vpc$ and $Von=Vnc$ when $clkp$ is active ($clkp=1$, $clkn=0$)

$Vop=Vnc$ and $Von=Vpc$ when $clkn$ is active ($clkp=0$, $clkn=1$).

This results in the equalities $Vop-Von=Vpc-Vnc$ when $clkp$ is active, and $Vop-Von=-(Vpc-Vnc)$ when $clkn$ is active.

Thus, the differential input Vp−Vn is multiplied by the clock signal clk such the signal Vp−Vn is downconverted from clk to DC, so $Vop-Von=(clkp-clkn)(Vpc-Vnc)$.

However, for the common mode the situation is different, i.e., the common mode output versus the common mode input relation is given by:

$Vop+Von=Vpc+Vnc$ when $clkp$ is active, and $Vop+Von=Vpc+Vnc$ when $clkn$ is active.

Thus, the common mode at the chopper stage output is the same as the input, so $Vop+Von=Vpc+Vpn$.

Thus, it can be seen that the chopper stage does not change the common mode signals input.

Also it will be understood that the RF mixer cell will behave like the chopper stage, i.e., the differential output versus the differential input relation will be given by the following:

When $LOn$ is active ($LOn=1$, $LOp=0$), then $Vp-Vcc=-Rip.Ip$ and $Vn-Vcc=-Rin.In$, and When $LOp$ is active ($LOn=0$, $LOp=1$), then $Vp-Vcc=-RiIp$ and $Vn-Vcc=-RinIp$.

So, $Vp-Vn=Ri(In-Ip)$ when $LOn$ is active, and $Vp-Vn=Ri(Ip-In)$ when $LOp$ is active.

Therefore, $Vp-Vn=(LOp-LOn)Ri(Ip-In)$.

Also, the common mode output versus the common mode input relation is given by:

$Vp+Vn=-Ri(Ip+In)+2\,Vcc$ when $LOn$ is active, and $Vp+Vn=-Ri(Ip+In)+2\,Vcc$ when $LOp$ is active, so it will be appreciated that the RF mixer stage does not change the common mode signal input.

Although the V-I converter is idealized as a linear stage, it will in practice introduce non-linear behavior on the output current that could be modelled as a polynomial relation versus the voltage input Vip and Vin. Considering only the second order output current and discarding the useful signal gives the following relations:

$Ip=a2p(Vip)^2$, $In=a2n(Vin)^2$

The generated second order current components will appear at low frequency. These second order currents generate a common mode current signal $Ip+In=a2p(Vip)^2+a2n(Vin)^2$ which will result at the RF mixer output as a common mode voltage signal, i.e., $Vp+Vn=-Ri(a2p(Vip)^2+a2n(Vin)^2)+2Vcc$ that occupies the same spectrum as the current signal, i.e., at low frequency, so that the AC coupling network will reduce the content in those low frequencies (the AC coupling corner frequency may be chosen to lie in the range of approximately 2.5% to 5% of the chopping clock frequency, and may be variable within this range by use of a programmable capacitor structure as mentioned above).

Also, considering the single ended voltage at the RF mixer output for those second order components (supposing now that Rip is different from Rin (i.e., there is resistor mismatch), produces the following relations:

$Vp=Vcc-Rip\ a2p\ (Vip)^2$ when $LOn$ is active, and $Vp=Vcc-Rip\ a2n\ (Vin)^2$ when $LOp$ is active, allowing *Vp to be expressed as:*

$Vp=Vcc-Rip(a2p(Vip)^2+a2n(Vin)^2)/2+(LOp-LOn)Rip(a2p(Vip)^2-a2n(Vin)^2)/2$, and Vn to be expressed as $Vn=Vcc-Rin(a2p(Vip)^2+a2n(Vin)^2)/2-(LOp-LOn).Rin.(a2p(Vip)^2-a2n(Vin)^2)/2$.

On both Vp and Vn, the term Rix $(a2p\ (Vip)^2+a2n\ (Vin)^2)/2$ appears as the low frequency common mode variation due to the second order components that will be DC blocked by the capacitors and reduced. The term (LOx−LOn) Rix $(a2p\ (Vip)^2-a2n\ (Vin)^2)/2$ will be shifted by the local oscillator frequency so it will be easy filtered such that its contribution is minimized.

Discarding the second term allows Vpc and Vnc to be expressed as:

$Vpc=Hpc*Vcc-Rip(a2p(Vip)^2+a2n(Vin)^2)/2*Hpc$, where Hpc is a high pass filter on the positive path and * denotes a convolution operation, and $Vnc=Hnc*Vcc-Rin(a2p(Vip)^2+a2n(Vin)^2)/2*\ Hnc$, where Hnc is a high pass filter on the negative path and * denotes a convolution operation.

At the output chopper, the following relations are satisfied:

$Vop+Von=Vpc+Vnc$, and $Vop-Von=(clkp-clkn)(Vpc-Vnc)$, producing the relations:

$Vop+Von=(Hpc+Hnc)*Vcc-(a2p(Vip)^2+a2n(Vin)^2)/2*(RipHpc+RinHnc)$, the second order common mode component being reduced by the AC coupling, and $$Vop-Von=(clkp-clkn)(Hpc-Hnc)*Vcc+(clkp-clkn)(a2p(Vip)^2+a2n(Vin)^2)/2)*(RinHnc-RipHpc).$$

This assumes a perfectly matched output chopper stage, i.e., {clkp}={clkn}. However, a non-perfectly matched output chopper (e.g., due to non–50% duty cycle clock or non-similar switches) will limit the reduction of differential second order component and will generate a term value that is equal to $$(dutycycle-50\%)(a2p\ (Vip)^2+a2n(Vin)^2)/2*(RinHnc-RipHpc).$$

In this case, the AC coupling will provide additional IP2 gain improvement versus a non-AC-coupling network if (Rin Hic–Rip Hpc) is much smaller than (Rin–Rip) in the low frequency region (0 to 200 KHz). However, the second order non-linearities that are introduced by the output chopper will limit the IM2 differential performances.

Figure 3:
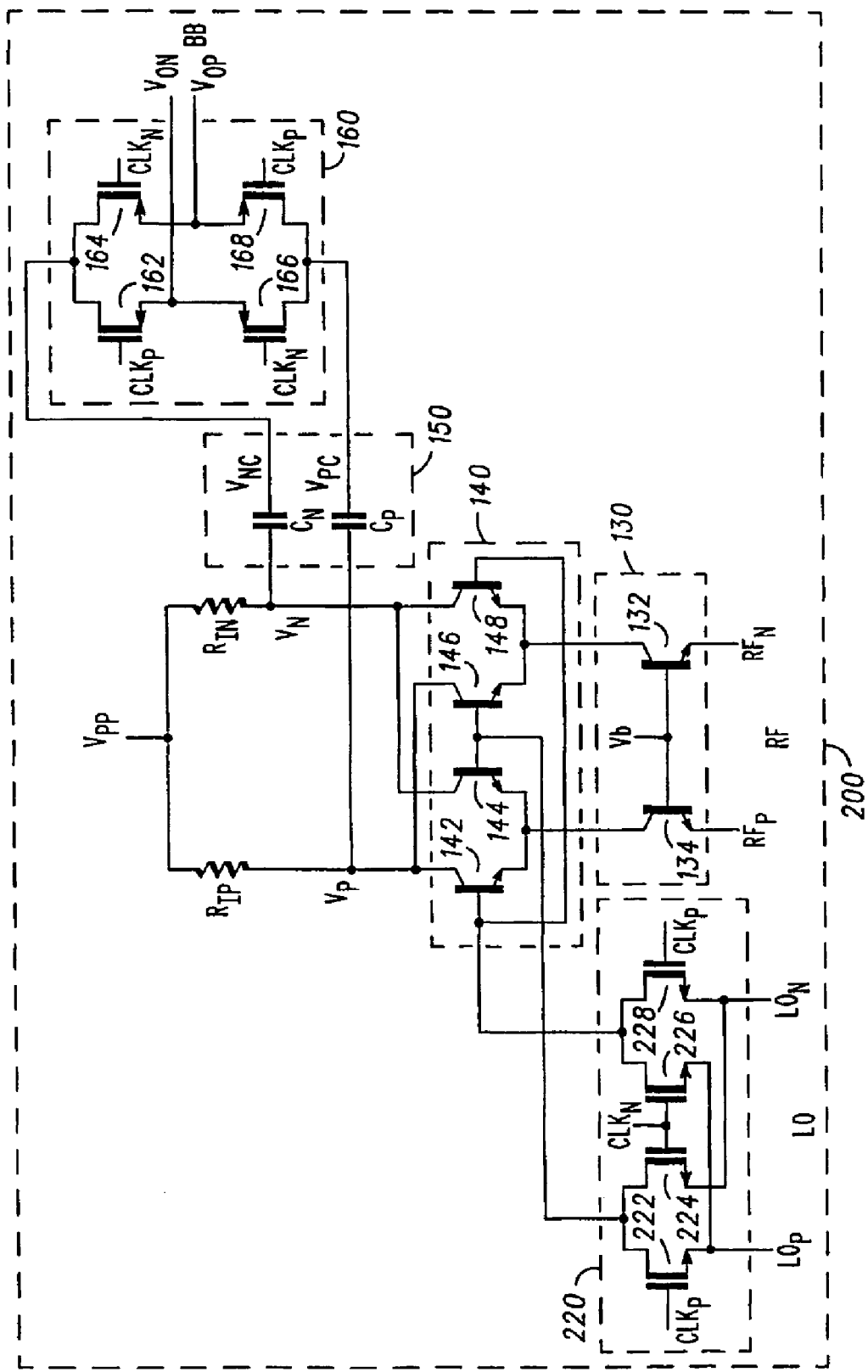
FIG. 3 shows a schematic circuit diagram of a second AC chopping mixer.

Referring now to FIG. 3, a second AC chopping mixer 200 (which may be used as an alternative to the AC chopping mixer 100 described above) shares many components with the mixer 100, and these shared components are given the same reference numerals in FIG. 3 as in FIG. 1.

The second AC chopping mixer 200 differs from the mixer 100 in that (whereas in the first mixer 100 the LO input is coupled directly to the mixer cell 140, and the RF input is coupled to the mixer cell 140 via a chopping cell 120 and a voltage-current converter cell 130) in the second mixer 200 the LO input is coupled to the mixer cell 140 via a chopper cell 220 (constituted of MOSFET chopper transistors 222, 224, 226 and 228), and the RF input is coupled to the mixer cell 140 via the voltage-current converter cell 130. It will be seen that in the second mixer 200, as in the mixer 100, the output of the mixer cell 140 is coupled via an AC coupling cell 150 to an output chopping cell 160, whose output is connected to the BB output.

It will be appreciated that the second mixer 200 functions similarly to the mixer 100 described above. It will also be appreciated that both the first and second mixers will respond in a non-ideal manner to signals at the RF input port that differ from the local oscillator frequency at the LO input port by an integer multiple of the frequency fclk of the chopping clock signals *clkn and clkp*. However, it will be understood that in the second mixer 200 this non-ideal signal response is diminished, relative to the first mixer 100, by movement of the input chopping stage from the RF input port in the first mixer to the LO input port in the second mixer. In this way, it will be appreciated, the second mixer 200 offers better performance than the first mixer 100 through higher spurious response isolation.

It will be understood that the method and apparatus for improving chopping mixer performance described above provides the following advantages:

By AC coupling the bipolar mixer output when it is operating in chopping mode, an advantage is gained since the signal prior to the output chopping stage is centered at the chopping clock frequency rather than at DC.

Also, AC coupling allows removal of the common mode signal in the required frequency range of 0–200 KHz.

Also, the second order component present on each single ended output will be also DC blocked by the coupling capacitors, which results in an improvement in the second order IP2.

The chopper mixers and the RF bipolar mixer have similar behavior, their common mode output versus common mode input is equal to 1 and do not result on any frequency translation; however, the differential input will be translated in frequency. This means that only low frequency common mode signals (0–200 khz) that are generated within the whole mixer arrangement will be at the output as low frequency common mode signals. Most of these low frequency common mode signals are generated by the second order non-linearities of the mixer arrangement, mainly in the V-I converter stage, but the AC coupling will block those components and reduce their levels.

What is claimed is:

1. A chopping mixer comprising:
   input chopping means for chopping an input signal applied thereto and for producing therefrom a chopped input voltage signal;
   mixer means for mixing signals received thereby and for producing a mixed signal therefrom;
   output chopping means;
   coupling means for coupling the mixed signal to the output chopping means; and
   voltage to current converter means coupled between the input chopping means and an input of the mixer means for converting a voltage signal to a current signal for applying to the mixer means a current signal representative of the chopped input voltage signal;
   wherein the coupling means comprises AC coupling means arranged to filter out second order distortion in the signal from the mixer means.

2. The chopping mixer of claim 1 wherein the AC coupling means comprises capacitance means for passing AC signals while blocking DC signals.

3. The chopping mixer of claim 1 wherein the mixer means comprises a bipolar transistor mixer.

4. The chopping mixer of claim 1 wherein the output chopping means comprises MOSFET transistors.

5. The chopping mixer of claim 1 further comprising input chopping means for chopping an input signal applied thereto and for coupling the chopped input signal to the mixer means.

6. The chopping mixer of claim 5 wherein the input chopping means comprises MOSFET transistors.

7. The chopping mixer of claim 1 wherein the signals are differential signals.

8. The chopping mixer of claim 1 wherein the AC coupling means has a corner frequency that is in the range of approximately 2.5% to 5% of the frequency of the chopping means.

9. A direct conversion radio receiver comprising a chopping mixer as claimed in claim 1.

* * * * *